(12) United States Patent
Matsuyama et al.

(10) Patent No.: US 6,332,723 B1
(45) Date of Patent: Dec. 25, 2001

(54) SUBSTRATE PROCESSING APPARATUS AND METHOD

(75) Inventors: Yuji Matsuyama; Shuichi Nagamine, both of Kikuchi-gun; Koichi Asaka, Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/627,113

(22) Filed: Jul. 27, 2000

(30) Foreign Application Priority Data

Jul. 28, 1999 (JP) .................................................. 11-213748

(51) Int. Cl.[7] .............................. G03F 7/30; G03D 5/04; H01L 21/30
(52) U.S. Cl. .......................... 396/571; 396/611; 396/627; 134/105; 134/902
(58) Field of Search ..................................... 396/604, 611, 396/627, 571, 576; 118/52, 319, 320, 500, 666–668, 712, 716; 134/15, 33, 2, 3, 902, 105; 427/240

(56) References Cited

U.S. PATENT DOCUMENTS 4,519,846 * 5/1985 Aigo ........................................ 134/15
5,689,749 11/1997 Tanaka et al. .......................... 396/611
5,815,762 9/1998 Sakai et al. ............................ 396/611

FOREIGN PATENT DOCUMENTS 3-179728-A * 8/1991 (JP) .
3-241820-A * 10/1991 (JP) .
6-163393-A * 6/1994 (JP) .

* cited by examiner

*Primary Examiner*—Alan A. Mathews
(74) *Attorney, Agent, or Firm*—Rader, Fishman & Grauer, PLLC

(57) ABSTRACT

In a state where a wafer is held by a wafer holding section and a temperature controlled liquid is discharged to a rim area on a rear face of the wafer from flow channels, a developing solution is heaped on a front face of the wafer. Thereafter, the wafer is rotated for a predetermined period of time in a state where the temperature controlled liquid is discharged to the rim area on the rear face of the wafer from the flow channels, whereby developing is performed. The wafer is heated by the wafer holding section with a large heat capacity in an area close to a center of the wafer, and a liquid film of the temperature controlled liquid is formed in the rim area of the wafer, whereby the wafer is heated. At this time, the wafer is rotated, so that the developing solution is stirred.

19 Claims, 12 Drawing Sheets

PRIOR ART

SUBSTRATE PROCESSING APPARATUS AND METHOD

CROSS-REFERENCE TO RELATED APPLICATIONS

This application is based upon and claims the benefit of priority from the prior Japanese Patent Application No. 11-213748, filed Jul. 28, 1999, the entire contents of which are incorporated herein by reference.

BACKGROUND OF THE INVENTION

The present invention relates to a substrate processing apparatus and method for performing, for example, substrate processing such as developing processing and the like for a substrate.

A mask for forming a predetermined pattern on a front face of a semiconductor wafer (hereinafter, referred to as "wafer") or a glass substrate (LCD substrate) of a liquid crystal display is obtained by applying a resist to the front face of a wafer or the like and then radiating rays of light, electron rays, ion beams, or the like to the resist surface, and performing developing.

The developing processing here is performed by dissolving portions irradiated with light or the like or portions without such irradiation in an exposure process with use of an alkaline water solution or the like, and conventionally it has been performed as follows. The technique is that, as shown in FIG. 11A, a substrate, for example, a wafer W is first suction-held, for example, on a spin chuck 10 having a vacuum suction function, and a supply nozzle 11 in a rod shape having many discharge holes is placed above the center of the wafer W. Then, as shown in FIG. 11B, the wafer W is rotated 180 degrees while a developing solution D is supplied to the wafer surface from the supply nozzle 11 to thereby perform heaping of the developing solution D on the resist film. Subsequently, as shown in FIG. 11C, the wafer W is left untouched for 60 seconds with the rotation of the wafer W being stopped, and thereafter a rinse liquid is supplied onto the wafer surface to wash away the developing solution.

However, for example, in the case of using an I-line resist, developing unevenness occurs in the above-described developing method, whereby developed line width varies depending on position, which causes a disadvantage, for example, a difference in line width of about 4 nm between an area close to the center of the wafer and a rim portion thereof. From a study of a cause of the above, it is conceivable that degrees of proceeding of the developing depend on the temperature of the developing solution D, and therefore temperature distribution occurs in the developing solution D within the plane of the wafer. In other words, the developing solution D is controlled to a temperature of, for example, about 23° C., but water contained in the developing solution D evaporates while the wafer W is subjected to the solution heaping and then left untouched, whereby latent heat in the developing solution D is lost, and thus the temperature of the developing solution D decreases with time as shown in FIG. 12.

On the other hand, the spin chuck 10 for holding an area close to the center of the wafer has a certain size to perform ascent and descent and rotation while holding the wafer W. Moreover, the spin chuck 10 is maintained at a temperature of, for example, about 23° C. by, for example, a temperature controlled water so that a thermal influence from a motor (not shown) for driving the spin chuck 10 is eliminated. Accordingly, it is conceivable that the spin chuck 10 has a large heat capacity, and degrees of temperature decrease of the developing solution D is different between a portion of the wafer W in contact with the spin chuck 10 and a portion not in contact therewith, and thus the temperature of the area close to the center of the wafer is hard to decrease compared with the rim portion thereof.

Therefore, it is presumed that temperature difference in the developing solution D of about 1° C. occurs between the area close to the center of the wafer and the rim portion thereof at the start of a rinse, whereby there occurs unevenness in the developing state, resulting in variations in finished measurements.

BRIEF SUMMARY OF THE INVENTION

An object of the present invention is to provide a substrate processing apparatus and method for enhancing uniformity of processing by making temperatures in a processing liquid uniform within a plane of a substrate to thereby suppress occurrence of processing unevenness because of temperature difference in the processing liquid.

According to the present invention, there is provided a substrate processing apparatus comprising: a substrate holding section configured to hold the substrate; a processing liquid supply section configured to supply a processing liquid to the substrate; and a temperature control section configured to heat an opposite face to a face to be processed of the substrate, wherein the substrate which has been supplied with the processing liquid is held by the substrate holding section for a predetermined period of time while the opposite face of the substrate is heated by the temperature control section. At this time, for example, the substrate holding section holds an area close to a center of the opposite face to the face to be processed of the substrate, and the temperature control section heats a rim area outside an area held by the substrate holding section of the opposite face to the face to be processed of the substrate.

According to the present invention, there is provided a substrate processing method, in the above-described apparatus, for supplying a processing liquid to a substrate to thereby perform processing, comprising the step of: supplying the processing liquid to the substrate while the substrate is held by a substrate holding section; and holding the substrate which has been supplied with the processing liquid by the substrate holding section for a predetermined period of time while the opposite face of the substrate is heated by a temperature control section.

In the above configuration, since the substrate which has been supplied with the processing liquid is held by the substrate holding section for the predetermined period of time while the opposite face of the substrate is heated by the temperature control section, the substrate is heated by the substrate holding section in the area close to the center of the substrate and heated by the temperature control section in the rim area of the substrate. Thereby, temperature variations in the processing liquid on the substrate are made almost uniform within the plane of the substrate and occurrence of processing unevenness because of temperature difference in the processing liquid is suppressed, so that the uniformity of processing can be enhanced.

Here, the temperature control section can be a temperature controlled liquid supply portion configured to supply the temperature controlled liquid to positions at which the opposite face to the face to be processed of the substrate is divided into equal parts in an angular direction thereof or can be a heating portion configured to heat the opposite face to the face to be processed of the substrate.

Further, in the substrate processing apparatus, it is suitable that the substrate holding section is provided to be rotatable around a vertical axis, and the step of supplying the processing liquid to the substrate and/or the step of holding the substrate for the predetermined period of time are/is performed while the substrate is rotated. In this case, since the processing liquid on the substrate is stirred by an inertial force of the rotation of the substrate, temperatures in the processing liquid on the substrate are made uniform within the plane of the substrate, so that the uniformity of processing is improved.

Furthermore, it is also suitable that the processing liquid supply section has supply holes formed along the substrate and is provided to be rotatable relative to the substrate holding section. Incidentally, as a concrete example of the substrate processing, developing processing using a developing solution as the processing liquid can be given.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
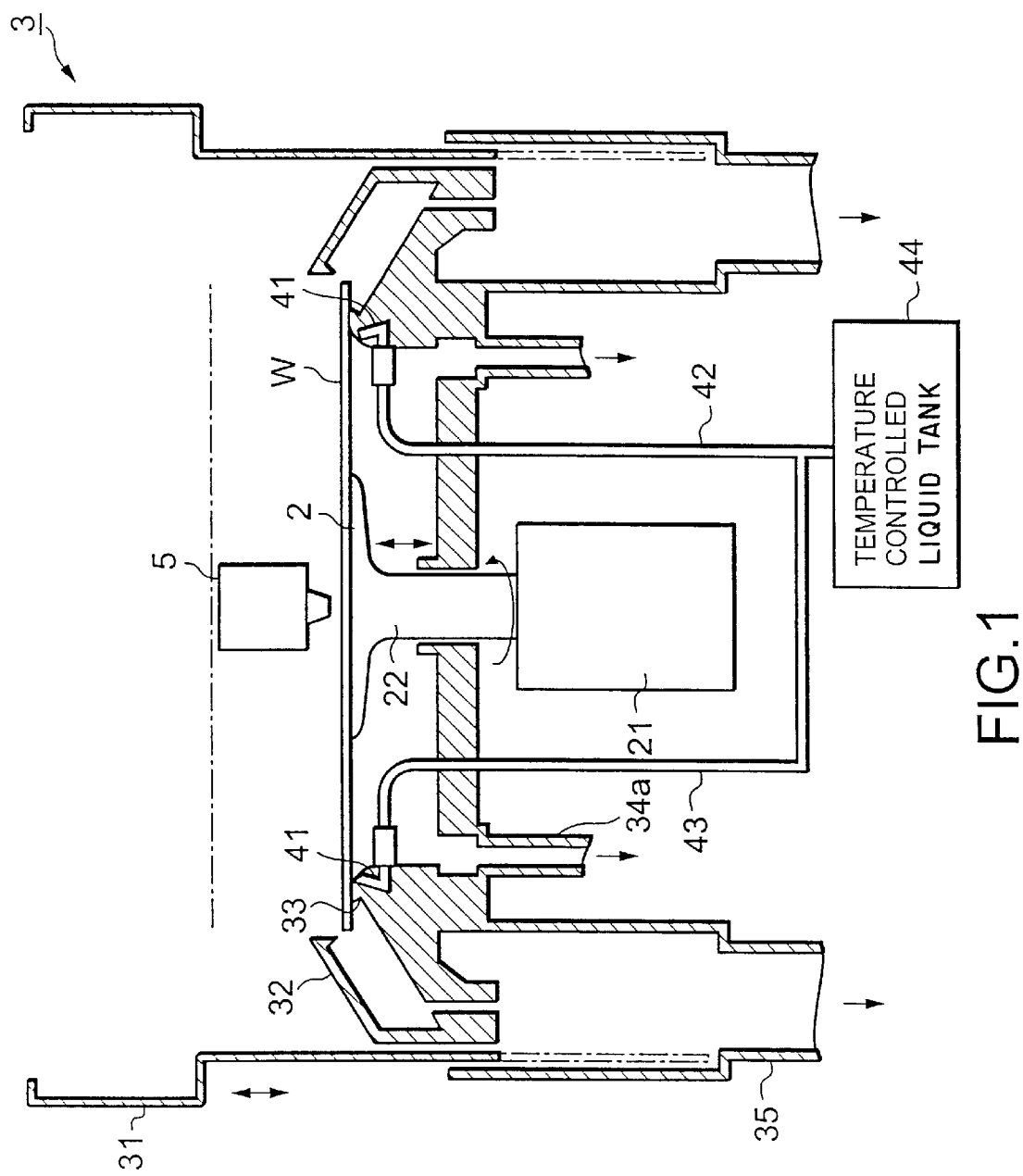
FIG. 1 is a sectional view showing a developing apparatus according to an embodiment of the present invention, in the case where the present invention is applied to developing processing.

FIG. 1 is a vertical sectional view of a developing apparatus to which the present invention is applied, and numeral 2 in FIG. 1 is a wafer holding section made of, for example, resin for holding an area close to the center of a wafer W, which is a substrate to be processed, in an almost horizontal state so that a face to be processed of the wafer W facing upward, and for rotating the wafer W around a vertical axis, and raising and lowering the wafer W. This wafer holding section 2 forms a substrate holding section, has, for example, a vacuum suction function, and is configured to be rotatable around the vertical axis and ascendable and descendable by means of a drive section 21 in which a raising and lowering mechanism and a motor are combined through a rotation shaft 22. Thus, the wafer W is held by the wafer holding section 2 to be ascendable and descendable and rotatable between a processing position where the wafer W is suction-held by the wafer holding section 2, as shown in FIG. 1, and a delivery position for the wafer W, shown by a one-dotted chain line in FIG. 1, above the processing position.

Around the above-described wafer holding section 2, provided is a cylindrical cup 3 for enclosing the periphery of the wafer W placed at the processing position to prevent a processing liquid, for example, a developing solution which is supplied onto the wafer from splashing thereabout when the processing liquid goes off. The cup 3 comprises an outer cup 31 and an inner cup 32. The outer cup 31 is configured to be ascendable and descendable by a raising and lowering mechanism (not shown) so that an upper end of the outer cup 31 is positioned above the delivery position for the wafer w at the time of preventing the processing liquid from the splashing about, and the upper end of the outer cup 31 is positioned below the delivery position for the wafer W at the time of delivering the wafer W and the time of applying the processing liquid.

The inner cup 32 is provided inside the outer cup 31 and below the delivery position for the wafer W so that an upper end of the inner cup 32 is positioned above the wafer W when the wafer W is placed at the processing position. This inner cup 32 is inclined inward toward a top at the side of the wafer W. An annular projecting portion 33 is provided below the wafer W in such a manner to contact or not to contact the rim on the rear face side of the wafer W placed at the processing position to prevent the processing liquid from coming onto the rear face side of the wafer W. Thus, the inner cup 32 is formed to be inclined upward toward the projecting portion 33 from the outside of the wafer W.

Moreover, for example, at two positions in the inner cup 32 formed are flow channels 41 for a temperature controlled liquid A, composing a temperature controlled liquid supply portion for supplying the temperature controlled liquid A, for example, a temperature controlled water to the rim area (an area outside a held area when the wafer W is held by the wafer holding section 2) on the rear face side of the wafer W. The flow channels 41 are provided at a spaced interval of about 180° to supply the temperature controlled liquid A to positions, for example, at which the rim area on the rear face side of the wafer W is divided into two equal parts in an angular direction thereof.

Figure 2:
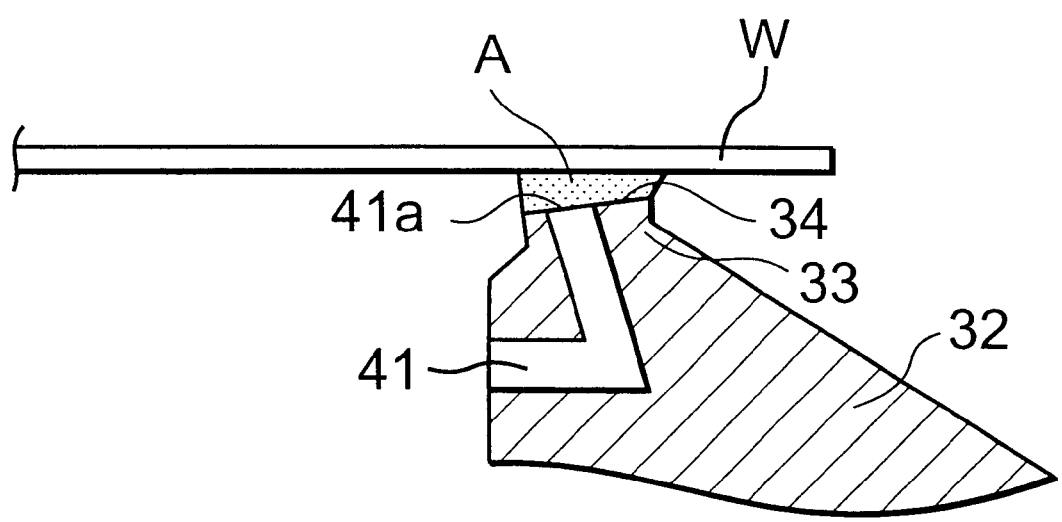
FIG. 2 is a sectional view showing a flow channel for a temperature controlled liquid used in the aforesaid developing apparatus.

For instance, as shown in FIG. 2, for example, the inside of the projecting portion 33 of the inner cup 32 is an inclined face 34 inclined slightly downward toward the center of the wafer. The flow channels 41 are formed such that discharge ports 41a (see FIGS. 7A and 7B) are positioned, for example, at the inclined face inside the projecting portion 33. Further, the other end sides of the flow channels 41 opposite to the discharge ports 41a are connected to a common temperature controlled liquid tank 44 in which the temperature controlled water which is controlled at a temperature of, for example, 25° C. to 27° C. is stored via respective supply pipes 42 and 43 for the temperature controlled liquid A. Thereby, the temperature controlled liquid A which is controlled at a predetermined temperature is supplied to a portion between the rear face side of the wafer W and the inclined face 34 of the wafer holding section 2 through the flow channels 41, so that a liquid film of the temperature controlled liquid A is formed in an area close to the portion sandwiched between the rear face side of the wafer W and the inclined face 34.

Furthermore, a drainage channel 34a for a processing liquid and an ejection passage 35 serving as an exhaust passage and a drainage passage are connected to the cup 3, and the ejection passage 35 is connected to gas-liquid separating means (not shown).

Figure 3A:
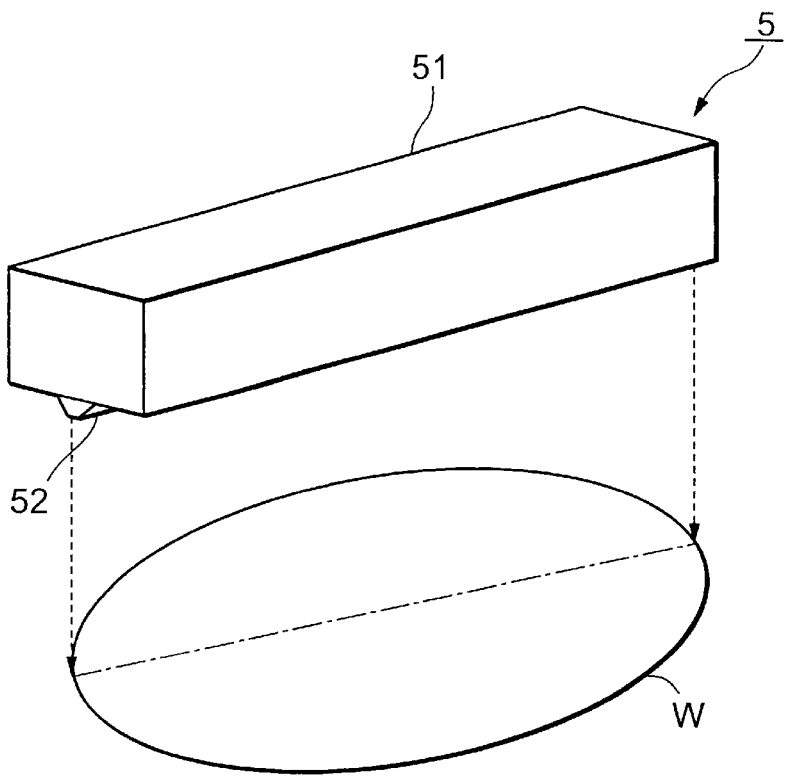
FIGS. 3A and 3B are a perspective view and a bottom view showing a nozzle used in the aforesaid developing apparatus, respectively.
Figure 3B:
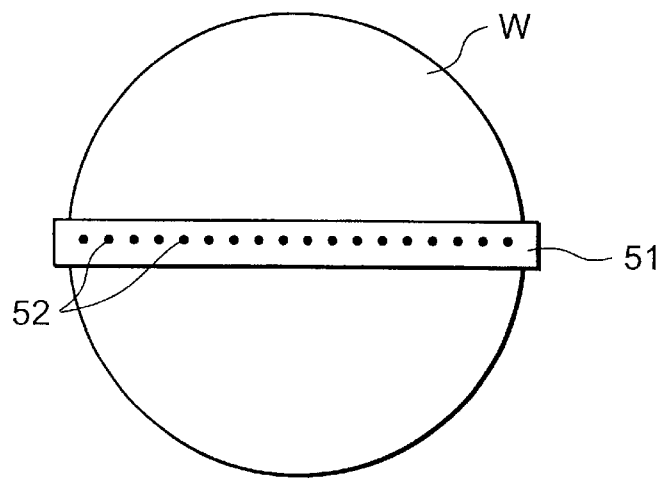

A nozzle 5 composing a processing liquid supply section for supplying a developing solution D that is a processing liquid onto the front face of the wafer W is provided above the wafer W placed at the processing position where the wafer W is suction-held by the wafer holding section 2. As shown in FIGS. 3A and 3B, this nozzle 5 includes a nozzle main body 51 which is formed, for example, in the shape of a horizontally elongated rod and supply holes 52, provided in the under face of the nozzle main body 51, for discharging the developing solution onto the front face of the wafer W along a radial direction thereof. The nozzle main body 51 and the supply holes 52 are configured to supply the developing solution D to an area close to the center line (a line passing through the center of the wafer W and extending in the radial direction thereof) of the wafer surface.

Figure 4:
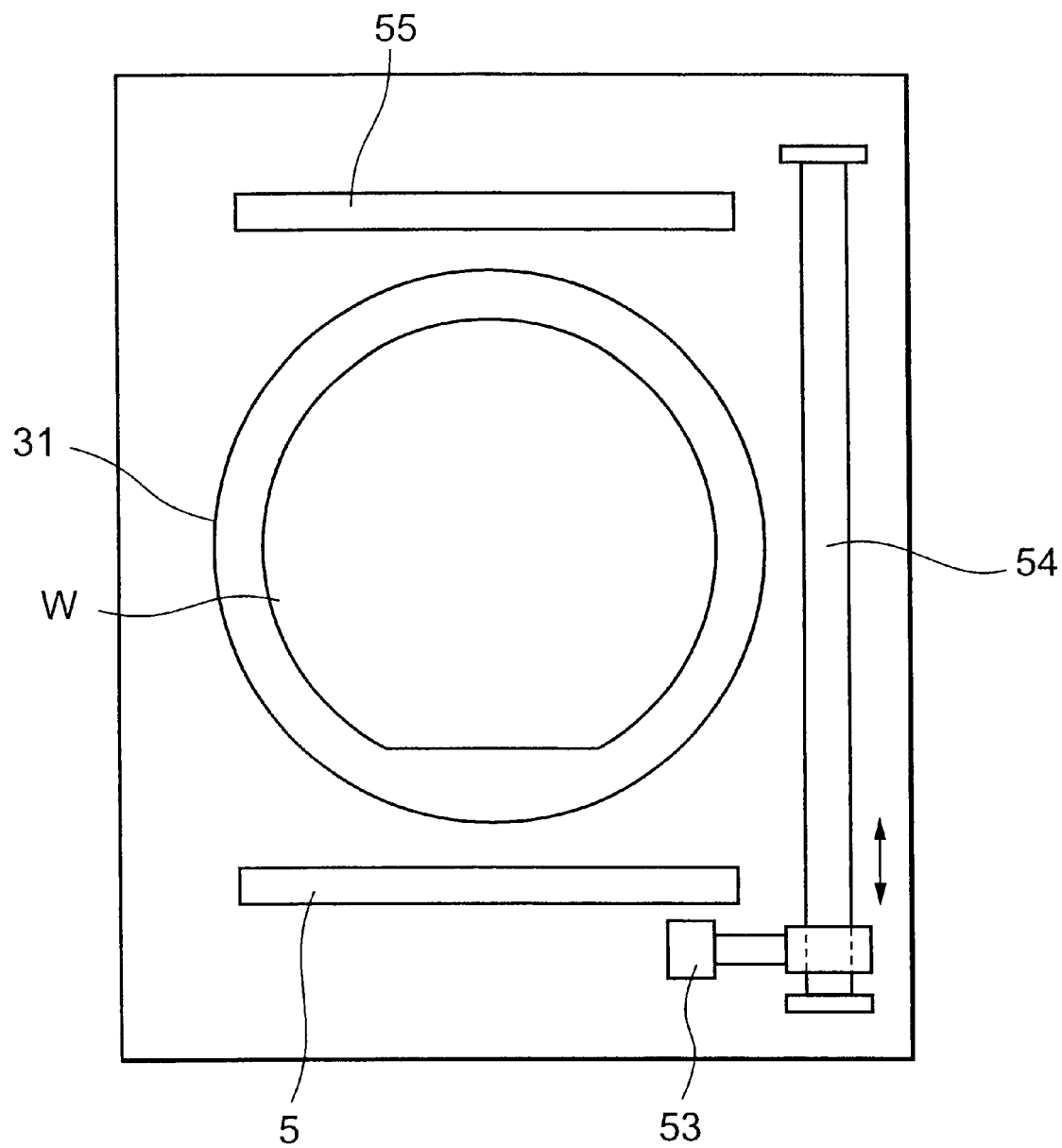
FIG. 4 is a plan view showing the aforesaid developing apparatus.

The nozzle 5 is configured to be held by a nozzle holding section 53 and horizontally movable along a guide rail 54, by way of example, as shown in FIG. 4, and to be ascendable and descendable by a raising and lowering mechanism (not shown). Whereby, the nozzle 5 can move between a stand-by position outside the wafer holding section 2 and an upper position above almost the center of the wafer holding section 2 so as not to interfere with the transfer of the wafer W. Further, the nozzle 5 is ascendable and descendable between the aforesaid upper position and a developing solution supply position that is a position directly below the upper position.

A developing solution storage tank (not shown) communicates with the above-described nozzle 5 via a supply pipe (not shown). Moreover, the developing apparatus includes a rinse nozzle 55 for supplying a rinse liquid R to rinse away the developing solution D onto the front face of the wafer W. This rinse nozzle 55 is structured in the same manner as the aforesaid nozzle 5 and held by the nozzle holding section 53 to be movable between a stand-by position outside the wafer holding section 2 and a supply position where the rinse liquid R is supplied onto the wafer.

Next, an embodiment of a method of the present invention performed using the aforesaid apparatus will be explained with the case in which it is applied to developing processing as an example, using FIGS. 5A to 5C and FIGS. 6A and 6B.

Figure 5A:
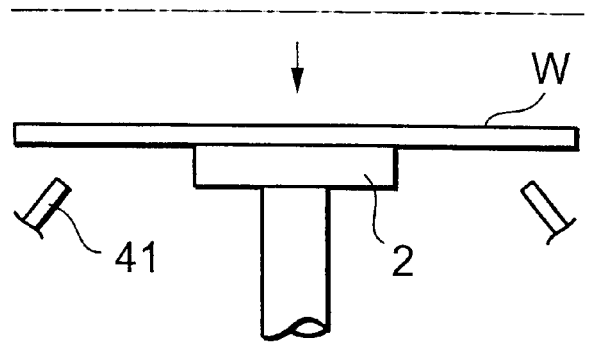
FIGS. 5A, 5B, and 5C are process views showing operations of the aforesaid developing apparatus.

First, as shown in FIG. 5A, the wafer holding section 2 is raised to the aforesaid delivery position, and a transfer arm (not shown) delivers a wafer W, on which a resist film has been formed and exposed, onto the wafer holding section 2 to allow the wafer holding section 2 to suction-hold the wafer W. Incidentally, for example, a mechanical chuck for mechanically pushing the rim of the wafer W may be used as a technique of pushing the wafer W to the wafer holding section 2.

Figure 5B:
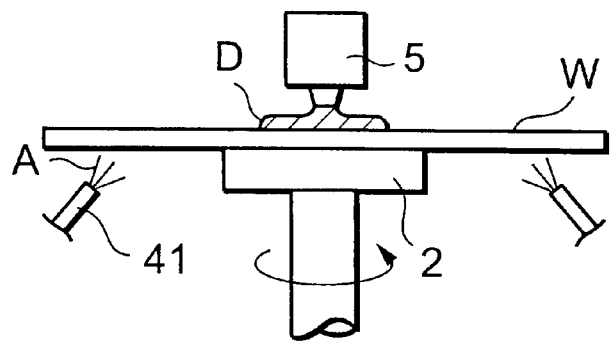

Then, as shown in FIG. 5B, the nozzle 5 placed at the stand-by position is moved to the supply position through the upper position above the wafer holding section 2, the developing solution D is discharged from the nozzle 5 to thereby supply the developing solution D to the area close to the center line of the wafer W, and the wafer holding section 2 is rotated at a rotation speed of, for example, about 30 rpm while the temperature controlled liquid A is discharged to the rear face side of the wafer W from the flow channels 41 formed in the inner cup 32, whereby heaping of the developing solution D is performed. More specifically, at the processing position, the tips of the supply holes 52 of the nozzle 5 contact the developing solution D that has been supplied onto the wafer surface from the nozzle 5. In that state, when the developing solution D is supplied from the supply holes 52 to the wafer surface while the wafer W is rotated 180 degrees, the developing solution D is applied on the entire face of the wafer W by diffusion of the developing solution D by centrifugal force of rotation and spread of the developing solution D by the supply holes 52 of the nozzle 5, whereby the solution heaping is performed.

Figure 7A:
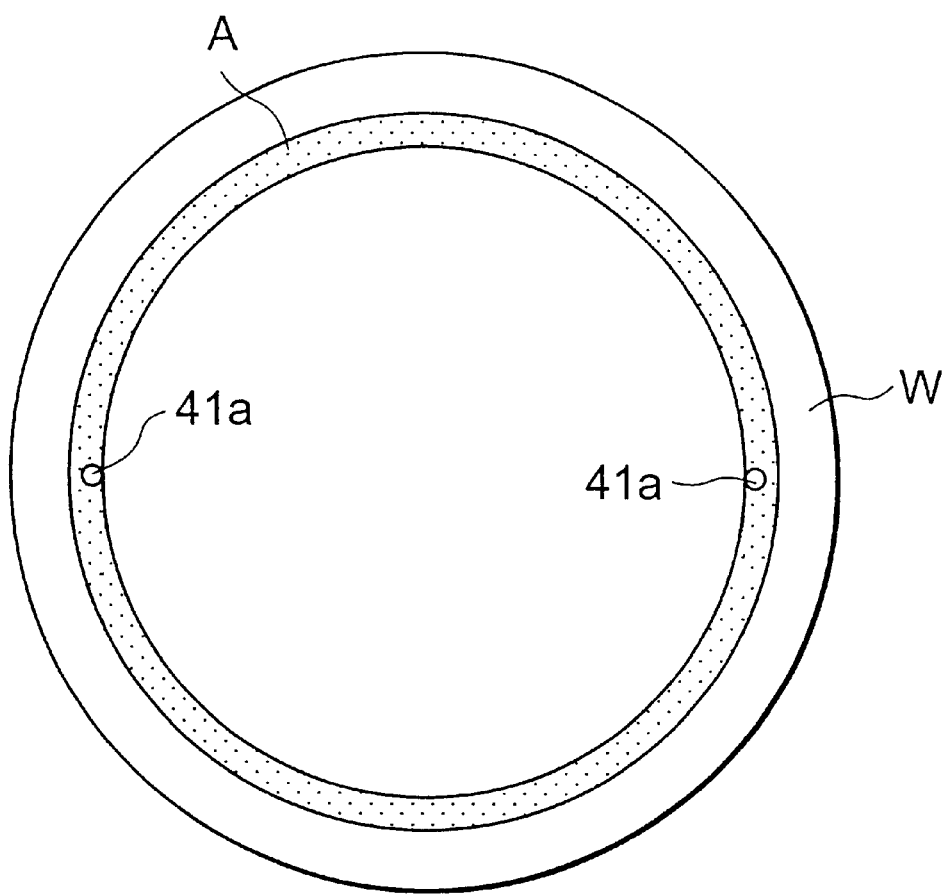
FIGS. 7A and 7B are a bottom view and a sectional view showing operations of the aforesaid developing apparatus, respectively.
Figure 7B:
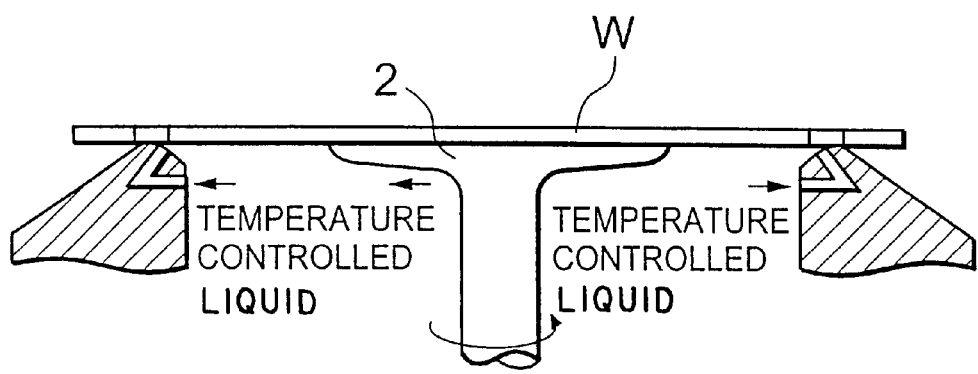

The temperature controlled liquid supplied to the portion between the rear face side of the wafer W and the inclined face 34 of the wafer holding section 2 and toward the two positions at which the rear face side of the wafer W is divided into two equal parts in an angular direction thereof spreads out to almost the entire periphery (360°) of the wafer W by the rotation of the wafer W, whereby, for example, an annular liquid film of the temperature controlled liquid A shown in FIGS. 7A and 7B is formed in the rim area on the rear face side of the wafer W. Since the discharge ports 41a of the flow channels 41 are formed at the inclined face 34 of the wafer holding section 2 and the inclined face 34 is positioned close to the rear face of the wafer W placed at the processing position, the temperature controlled liquid spreads out with being sandwiched between the inclined face 34 and the rear face of the wafer W as described above. By rotating the wafer W, the position of the inclined face 34 facing to the rear face of the wafer W shifts, thereby forming a liquid film of the temperature controlled liquid A with the same width as that of the inclined face 34 or with a predetermined width slightly larger than that of the inclined face 34, in a predetermined rim area on the entire periphery on the rear face side of the wafer W.

Figure 5C:
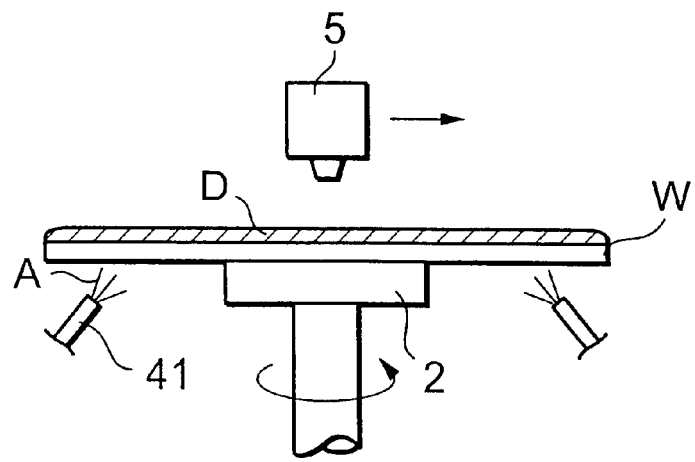

Subsequently, as shown in FIG. 5C, the nozzle 5 is moved to the stand-by position, while the wafer holding section 2 is rotated for, for example, 60 seconds at a low speed, for example, at a rotation speed of about 10 rpm while the temperature controlled liquid A is discharged from the flow channels 41 to the rear face side of the wafer w, whereby developing is performed. Accordingly, the developing is performed in a state where the liquid film of the temperature controlled liquid A is formed in a predetermined rim area on the entire periphery on the rear face side of the wafer W.

Figure 6A:
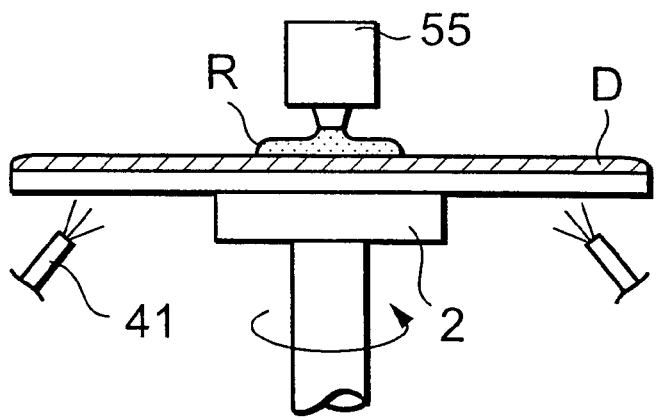
FIGS. 6A and 6B are process views showing operations of the aforesaid developing apparatus.
Figure 6B:
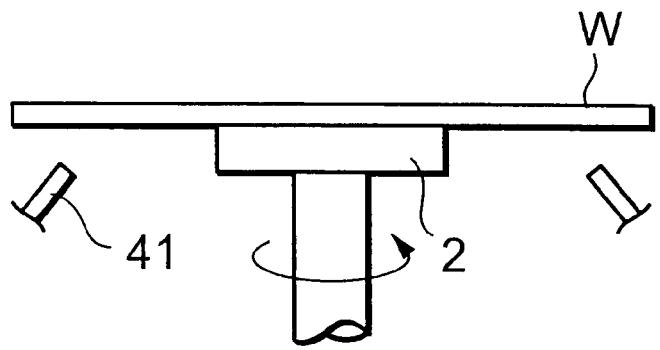

After the developing is performed as above, as shown in FIG. 6A, the rinse nozzle 55 placed at the stand-by position is moved to the supply position through the upper position above the wafer holding section 2, and the rinse liquid R is discharged from the rinse nozzle 55 while the wafer holding section 2 is rotated to thereby perform cleaning. Subsequently, as shown in FIG. 6B, the wafer W is rotated at a high speed to thereby dry the wafer surface, and thereafter the wafer holding section 2 is raised to the delivery position for the wafer W to deliver the wafer W to the transfer arm (not shown).

When the wafer W is delivered to the wafer holding section 2 or when the nozzle 5 or the rinse nozzle 55 is moved to the position above the wafer, the upper end of the outer cup 31 is positioned below the delivery position for the wafer W. When the developing solution D or the rinse liquid R is supplied to the wafer W, during the developing, or during the drying, the upper end of the outer cup 31 is positioned above the delivery position for the wafer W to perform predetermined processing.

In the above-described developing method, the heaping of the developing solution and the developing are performed while the temperature controlled liquid is supplied to the rim area on the rear face side of the wafer W, whereby temperature distribution in the developing solution D is hard to occur within the wafer surface, so that developing processing with high uniformity can be performed.

In other words, since the wafer holding section 2 is temperature-controlled at about 23° C., the area close to the center of the wafer W where the wafer W is held by the wafer holding section 2 is warmed by the contact with the wafer holding section 2. On the other hand, the liquid film of the temperature controlled liquid which is controlled at about 25° C. to about 27° C. is formed over the entire periphery in the rim area on the rear face side of the wafer W as described above, whereby the rim area is also warmed. Here, the temperature controlled liquid is higher than the wafer holding section 2 in temperature, that is because the wafer holding section 2 is larger in heat capacity. As a result, the area close to the center of the wafer W and the rim area thereof are actually controlled to the same temperature.

Since the area close to the center of the wafer W and the rim area thereof are controlled to the same temperature as above, there is no temperature difference in the developing solution D depending on these positions on the wafer W. Further, by rotating the wafer W, the developing solution D on the wafer is stirred by an inertial force of the rotation, so that the developing solutions D in the area close to the center of the wafer W and in the rim area thereof, and the developing solution D in a boundary area between the area close to the center and the rim area are mixed, as a result, temperatures in the developing solution D on the wafer W become almost uniform.

Therefore, since the developing is performed in a state where the temperatures in the developing solution D are almost uniform within the plane of the wafer, occurrence of developing unevenness because of temperature difference is suppressed, whereby variations in measurements of developed line width are suppressed, so that uniformity of the developing processing is improved. When the developing processing was actually performed for the wafer W to which an I-line resist was applied and exposed in a predetermined pattern form by the aforesaid developing apparatus, there was little differences in developed line width between the area close to the center of the wafer W and the rim portion, and it has been shown that uniform developing processing can be performed.

Figure 8:
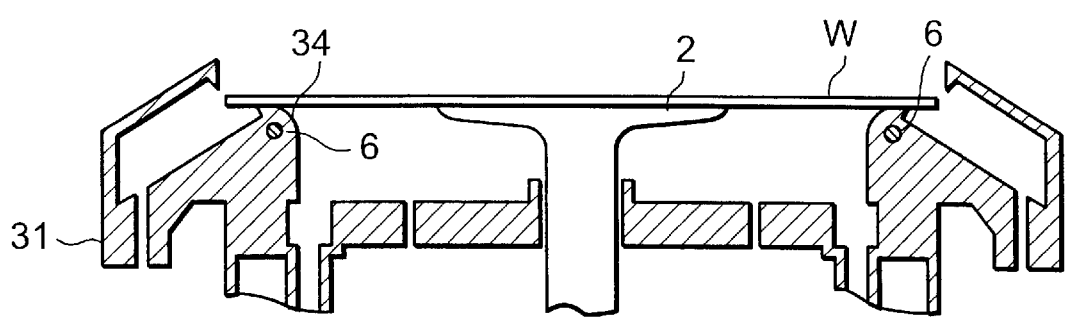
FIG. 8 is a sectional view showing a developing apparatus according to another embodiment of the present invention, in the case where the present invention is applied to developing processing.

Next, another embodiment of the present invention will be explained with reference to FIG. 8. This embodiment differs from the aforesaid developing apparatus in that a heater 6 composing a heating section that is the temperature control section is provided in the inner cup 32 in place of the formation of the flow channels 41 for the temperature controlled liquid. Concretely, the heater 6 is formed of, for example, a resistance heating wire and provided close to the inclined face 34 of the inner cup 32 over the entire periphery of the inner cup 32 to heat the area close to the rim area on the rear face side of the wafer W to be at a temperature of, for example, about 23° C.

Also in such a developing apparatus, the heaping of the developing solution D and the developing are performed in a state where the wafer W is rotated while the rim area on the rear face side of the wafer W is heated by the heater 6. Therefore, the rim area on the rear face side of the wafer W is heated to a temperature of about 23° C., whereby occurrence of temperature distribution in the developing solution within the wafer surface is suppressed, so that developing processing with high uniformity can be performed as in the aforesaid embodiment.

Figure 9:
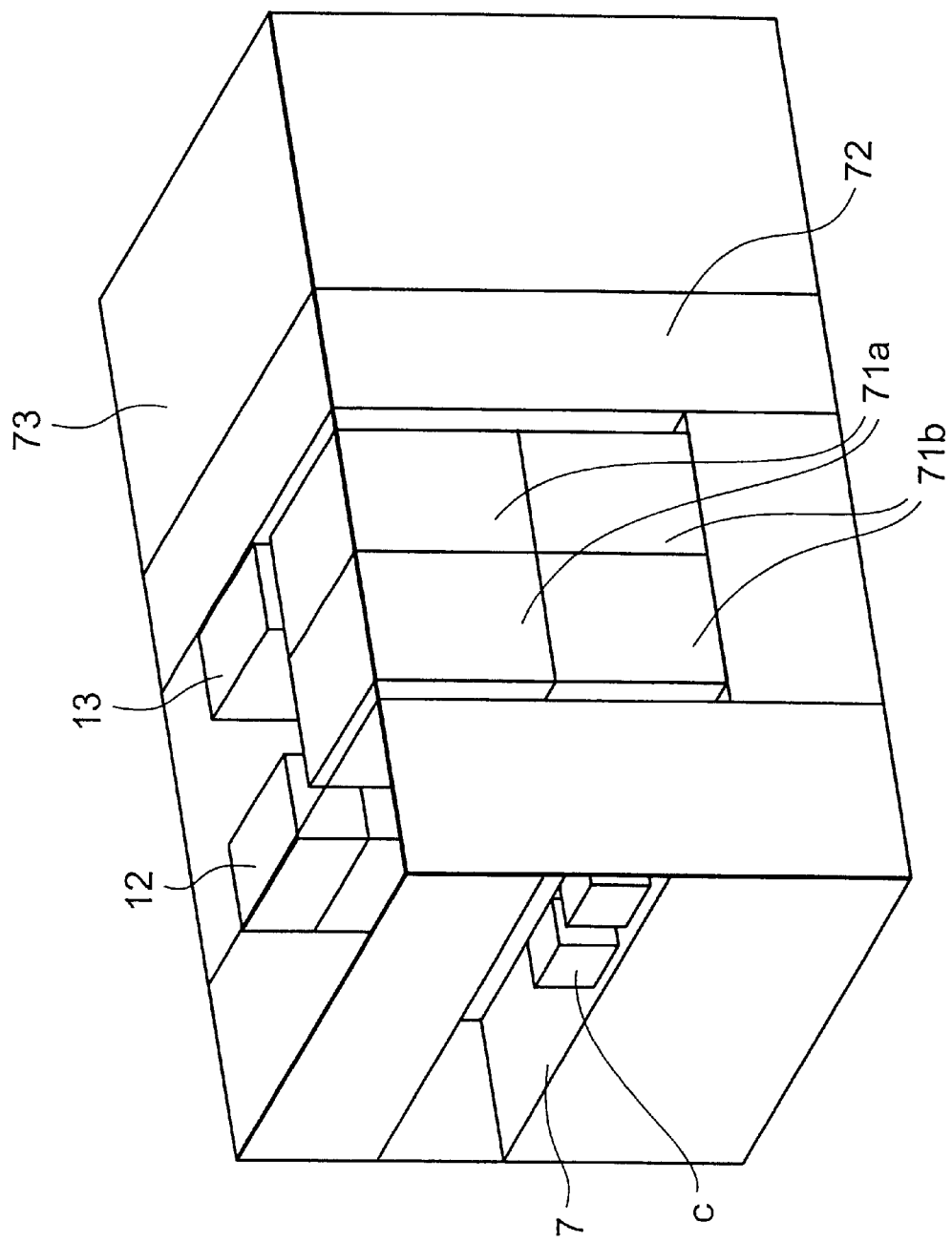
FIG. 9 is a perspective view showing an example of a coating and developing apparatus in which any one of the aforesaid developing apparatuses is installed.
Figure 10:
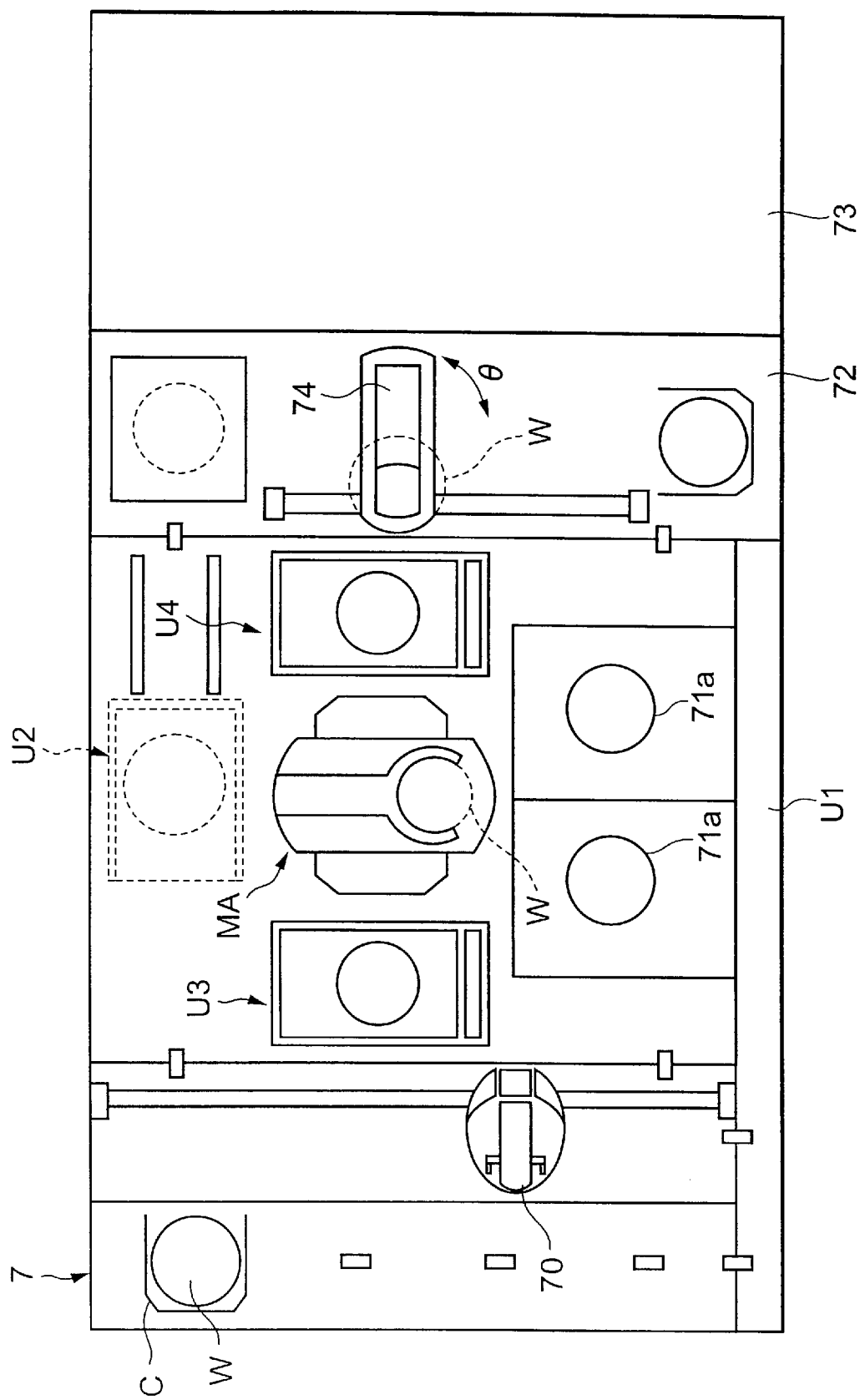
FIG. 10 is a plan view showing the example of the coating and developing apparatus in which any one of the aforesaid developing apparatuses is installed.
Figure 11A:
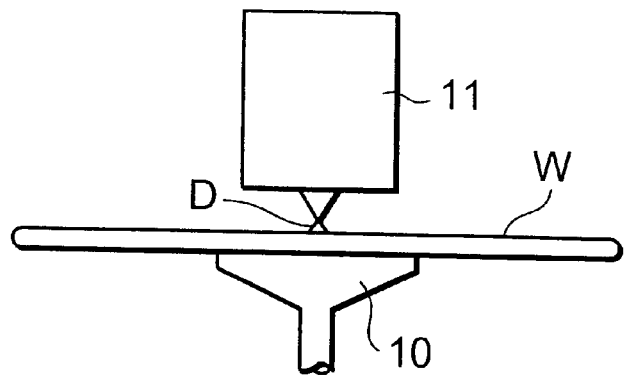
FIGS. 11A, 11B, and 11C are process views showing a conventional developing method.
Figure 11B:
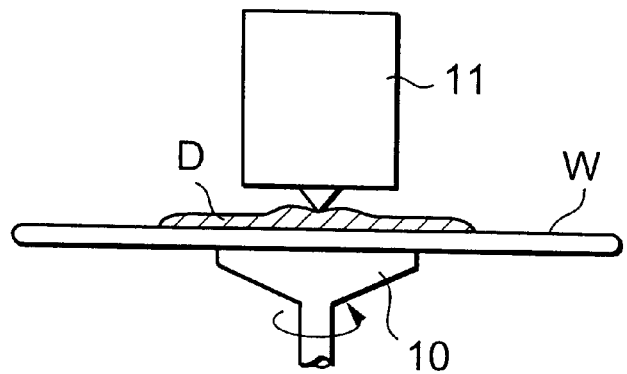
Figure 11C:
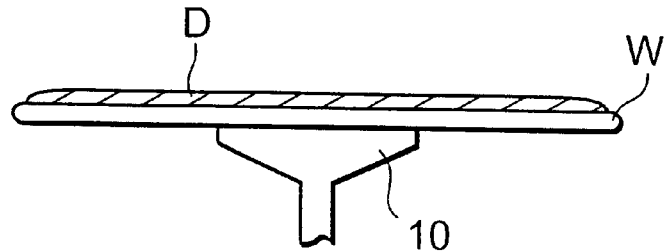
Figure 12:
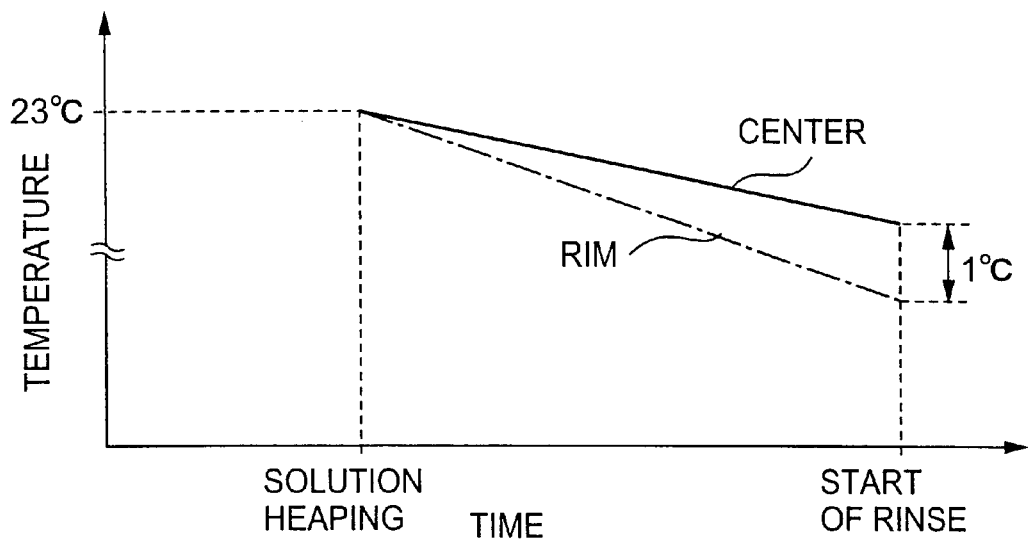
FIG. 12 is a chracterization graph showing changes in temperature of a developing solution in the prior art.

Next, an outline of an example of a coating and developing apparatus in which the developing apparatus used for carrying out the developing method according to the present invention is installed in a unit will be explained with reference to FIGS. 9 and 10. In FIGS. 9 and 10, numeral 7 is a carrying in/out stage for carrying in/out a wafer cassette, such that a cassette C in which, for example, 25 wafers W are housed is mounted thereon by, for example, an automatic transfer robot. A delivery arm 70 for the wafer W is provided to be movable in an X-direction and a Y-direction and rotatable in a θ-rotation (rotation around a vertical axis) in an area facing the carrying in/out stage 7. Moreover, on the back side of the delivery arm 70, a coating and developing system unit U1 is arranged, for example, on the right side, for example, seeing from the carrying in/out stage 7 to the back side, and heating and cooling system units U2, U3, and U4 are arranged on the left side, the front side, and the back side, respectively. Further, a wafer transfer arm MA, which is, for example, ascendable and descendable, movable laterally and longitudinally, and rotatable around a vertical axis, for delivering the wafer W between the coating and developing system unit and the heating and cooling system units is provided. However, the unit U2 and the wafer transfer arm MA are not shown in FIG. 9 for convenience.

In the coating and developing system unit, for example, two developing units 71a are provided at the upper tier, and two coating units 71b are provided at the lower tier. In the heating and cooling system unit, a heating unit, a cooling unit, a hydrophobic processing unit, and the like are vertically arranged. Supposing that the aforesaid section including the described-above coating and developing system unit and the heating and cooling system units is called a clean track, an aligner or exposing apparatus 73 is connected to the back side of the clean track with an interface unit 72 therebetween. The interface unit 72 performs delivery of the wafer W between the clean track and the aligner 73 by a wafer transfer arm 74 which is configured to be, for example, ascendable and descendable, movable laterally and longitudinally, and rotatable around a vertical axis.

An explanation will be given of the flow of the wafer in this apparatus. First, a wafer cassette C in which wafers W are housed, is carried into the carrying in/out stage 7 from the outside, and the wafer w is taken out of the cassette C by the wafer transfer arm 70 and delivered to the wafer transfer arm MA via a delivery table that is one of shelves in the aforesaid heating and cooling unit U3. Then, the wafer W is subjected to hydrophobic processing in a processing section at one shelf in the unit U3 and thereafter coated with a resist solution in the coating unit 71b, whereby a resist film is formed. The wafer W coated with the resist film is heated in the heating unit and then transferred to the aligner 73 via the interface unit 72, and subjected to an exposure process in the aligner 73, using a mask corresponding to a pattern.

Thereafter, the wafer W is heated in the heating unit and then cooled in the cooling unit. Subsequently, the wafer W is transferred to the developing unit 71a to be subjected to developing processing, whereby a resist mask is formed. Thereafter, the wafer w is returned to the cassette C on the carrying in/out stage 7.

In the above, a substrate is not limited to a wafer, but a glass substrate for a liquid crystal display is suitable in the present invention, and the present invention is applicable to coating processing or the like in addition to the developing processing. Further, the flow channel 41 for the temperature controlled liquid is not limited to the above-described configuration in number, form, installation position, or the like, but a flow channel may be configured, for example, in annual form if it supplies the temperature controlled liquid to the rim area on the rear face side of the wafer W. Furthermore, as the temperature control section, the heating by the heater 6 and the supply of the temperature controlled liquid from the flow channels 41 may be used in combination. Moreover, a warm air sending section for sending warm air in place of the temperature controlled liquid may be provided.

Further, the developing may be performed with the rotation of the wafer W being stopped, and the heating on the rear face side of the wafer W by the temperature control section may be stopped during the time when the developing solution is heaped. The heating by the temperature control section may not be continuously performed during the processing, such as the time when the developing solution is heaped or the developing, but may be performed during part of the processing time. However, the temperature effect is enhanced and uniform processing can be performed, where the developing is performed while the wafer W is rotated and the heating by the temperature control section is continuously performed during the time when the developing solution is heaped or during the developing.

Figure 13:
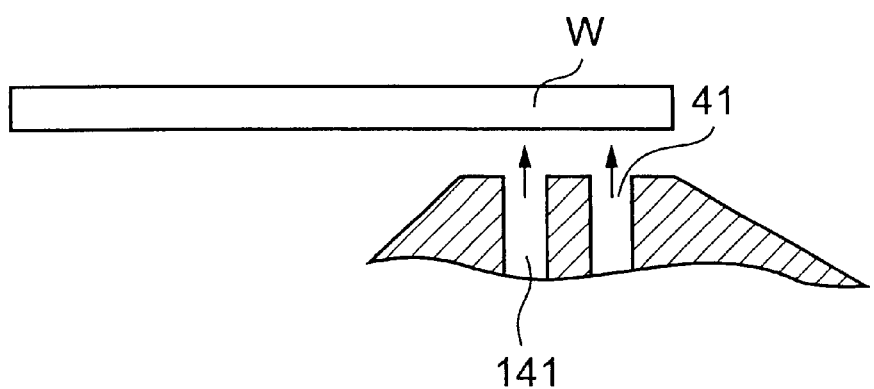
FIG. 13 is a partial sectional view showing a developing apparatus according to still another embodiment of the present invention.

Moreover, as shown in FIG. 13, another flow channel 141 may be further provided inside the flow channel 41. Commonly, the wafer W decreases in temperature the closer to the outer periphery it becomes, and thus the supply of the temperature controlled liquid from the flow channel 41 is first started, and after a predetermined period of time, the supply of the temperature controlled liquid from the flow channel 141 is started, whereby the temperatures within the wafer W can be made more uniform. Further, the temperature of the temperature controlled liquid supplied from the flow channel 41 may be made higher than the temperature of the temperature controlled liquid supplied from the flow channel 141, whereby the same effect can be obtained. Moreover, even if the flow channel 141 is configured to draw in the temperature controlled liquid supplied from the flow channel 41 to the inside on the rear face of the wafer W as a suction channel, the same effect can also be obtained.

According to the present invention, degrees of temperature variation of a processing liquid within a surface of a substrate are made uniform and thus uniformity in temperature of the processing liquid within the plane of the substrate is enhanced, whereby occurrence of processing unevenness because of temperature difference in the processing liquid is suppressed, so that processing with high uniformity can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for applying a developing solution of a resist to a substrate having a bottom face and a top face, comprising:
   a holder configured to hold the bottom face of the substrate by being in contact with a near center area close to a center of the bottom face of the substrate;
   a developing solution supply section configured to supply a developing solution to the top face of the substrate; and
   a temperature control section configured to heat the bottom face of the substrate by heating a peripheral area of the bottom face around the near center area while the substrate is held by the holder, in an applying period in which the developing solution is supplied to the top face, and in a developing period in which a developing process is performed with the developing solution applied to the top face.

2. The apparatus according to claim 1, wherein the temperature control section comprises a temperature controlled liquid supply portion configured to supply a temperature controlled liquid to the peripheral area of the bottom face.

3. The apparatus according to claim 2, wherein the temperature control section further comprises an opposing face disposed opposite to the peripheral area of the bottom face, and a liquid film is formed between the opposing face and the peripheral area from the temperature controlled liquid.

4. The apparatus according to claim 2, further comprising a rotational driver configured to rotate the holder and the substrate about a vertical axis.

5. The apparatus according to claim 4, wherein the temperature control section further comprises an opposing face disposed opposite to the peripheral area of the bottom face, and a liquid film formed between the opposing face and the peripheral area from the temperature controlled liquid by supplying the temperature controlled liquid to the peripheral area while rotating the holder and the substrate.

6. The apparatus according to claim 2, wherein the temperature controlled liquid supply portion is configured to supply the temperature controlled liquid to locations on the peripheral area of the bottom face equidistantly disposed in an angular direction.

7. The apparatus according to claim 2, wherein the temperature controlled liquid supply portion further comprises a first supply portion configured to supply the temperature controlled liquid to a first region, and a second supply portion configured to supply the temperature controlled liquid to a second region, said second region located radially inside the first region.

8. The apparatus according to claim 7, wherein the first supply portion begins supplying the temperature controlled liquid prior to the second supply portion supplying the temperature controlled liquid.

9. The apparatus according to claim 7, wherein the first supply portion supplies the temperature controlled liquid at a temperature greater than the temperature of the temperature controlled liquid from the second liquid supply portion.

10. The apparatus according to claim 1, wherein the holder is set at a first temperature, and the temperature control section heats the peripheral area of the bottom face to a second temperature higher than the first temperature.

11. The apparatus according to claim 1, wherein the temperature control section further comprising a heating portion solid face in contact with the peripheral area of the bottom face.

12. The apparatus according to claim 1, wherein the temperature control section further comprises a temperature controlled liquid suction portion located radially inside of the temperature controlled liquid supply portion and configured to suck the temperature controlled liquid.

13. The apparatus according to claim 1, wherein the developing solution supply section has supply holes arrayed in a radial direction of the substrate, and the developing solution supply section and the holder are rotatable relative to each other.

14. A method of applying a developing solution of a resist to a substrate having a bottom face and a top face, comprising the steps of:

holding the bottom face of the substrate by a holder, said holder in contact with a near center area close to a center of the bottom face of the substrate;

supplying a developing solution to the top face of the substrate by a developing solution supply section; and heating the bottom face of the substrate by heating a peripheral area of the bottom face around the near center area by a temperature control section while holding the substrate, in an applying period in which the developing solution is being supplied to the top face, and in a developing period in which developing process is performed with the developing solution applied to the top face.

15. The method according to claim 14, wherein the temperature control section hearts the peripheral area of the bottom face by causing a temperature controlled liquid supply portion to supply a temperature controlled liquid to the peripheral.

16. The method according to claim 15, wherein the temperature control section comprises an opposing face disposed opposite to the peripheral area of the bottom face, and a liquid film of the temperature controlled liquid is formed between the opposing face and the peripheral area, by supplying the temperature controlled liquid to the peripheral area while rotating the holder along with the substrate.

17. An apparatus that applies a resist developing solution to a substrate having a bottom face and a top face, comprising:

a developing solution supply section that supplies a developing solution to the top face of the substrate; and a temperature control section that heats the bottom face of the substrate, said temperature control section heating a peripheral area of the bottom face, said peripheral area between a center area of the substrate and an outer perimeter of the bottom face, in a first time period in which the developing solution is supplied to the top face, and in a second period in which a developing process is performed with the developing solution applied to the top face.

18. The apparatus of claim 17, wherein the temperature control section comprises a temperature controlled liquid supply portion that supplies a temperature controlled liquid to the peripheral area of the bottom face.

19. The apparatus of claim 18, wherein the temperature control section further comprises a discharge port disposed opposite to the peripheral area of the bottom face, and a liquid film is formed between the discharge port and the peripheral area from the temperature controlled liquid.

* * * * *